US009842480B2

(12) United States Patent
Terasawa et al.

(10) Patent No.: US 9,842,480 B2
(45) Date of Patent: Dec. 12, 2017

(54) ALARM PROCESSING CIRCUIT

(71) Applicant: FUJI ELECTRIC CO., LTD., Kawasaki-shi, Kanagawa (JP)

(72) Inventors: Noriho Terasawa, Matsumoto (JP); Yasuyuki Momose, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 4 days.

(21) Appl. No.: 14/807,385

(22) Filed: Jul. 23, 2015

(65) Prior Publication Data

US 2016/0063834 A1 Mar. 3, 2016

(30) Foreign Application Priority Data

Aug. 29, 2014 (JP) .................................. 2014-175712

(51) Int. Cl.
 *G08B 19/00* (2006.01)
 *H02M 1/32* (2007.01)
 *H03K 7/08* (2006.01)
 *H03K 17/082* (2006.01)
 *H03K 17/18* (2006.01)
 *H02M 7/5387* (2007.01)

(52) U.S. Cl.
 CPC .............. *G08B 19/00* (2013.01); *H02M 1/32* (2013.01); *H03K 7/08* (2013.01); *H03K 17/0828* (2013.01); *H03K 17/18* (2013.01); *H02M 7/5387* (2013.01)

(58) Field of Classification Search
 CPC .......... G08B 19/00; G08B 21/22; G08B 3/10; H02M 1/32; H02M 7/5387; H03K 7/08; H03K 17/18; H03K 17/0828; G01R 31/42; G01R 23/15
 See application file for complete search history.

(56) References Cited

U.S. PATENT DOCUMENTS

2014/0320297 A1\* 10/2014 Mori ...................... G01R 31/42
 340/658

FOREIGN PATENT DOCUMENTS

| JP | H05-300752 A | 11/1993 |
| JP | H11-17508 A | 1/1999 |
| JP | 2007-082360 A | 3/2007 |
| JP | 2009-142016 A | 6/2009 |
| JP | 4894604 B2 | 3/2012 |

OTHER PUBLICATIONS

Europe Patent Office, "Search Report for EP 15177974.1," dated Jan. 20, 2016.

\* cited by examiner

*Primary Examiner* — An T Nguyen
(74) *Attorney, Agent, or Firm* — Manabu Kanesaka

(57) ABSTRACT

An alarm processing circuit includes a plurality of abnormality detection circuits for detecting different abnormalities and outputting alarm signals respectively; a signal conversion circuit for converting the alarm signals outputted from the plurality of abnormality detection circuits into time signals with time widths corresponding to types of the abnormalities respectively; and a determination circuit for determining the types of the abnormalities respectively based on the time widths of the time signals outputted from the signal conversion circuit.

6 Claims, 10 Drawing Sheets

ALARM PROCESSING CIRCUIT

CROSS-REFERENCES TO RELATED APPLICATIONS

The present application claims priority from Japanese Application No. 2014-175712 filed Aug. 29, 2014, the disclosure of which is incorporated herein.

BACKGROUND OF THE INVENTION

Field of the Invention

The present invention relates to an alarm processing circuit which can be built and suitably used in an intelligent power module (IPM) etc.

Description of the Background Art

JP-A-H05-300752 discloses a technique in which a plurality of alarm signals sent from a plurality of abnormal current determination portions is inputted to an OR gate and an output signal of the OR gate is outputted as a single abnormal current alarm signal to the outside.

On the other hand, JP-A-2009-142016 discloses a technique in which two signals (one signal for setting a threshold and the other signal for driving a switching element) inputted from the outside are transmitted to a power conversion circuit through one photocoupler in a time division manner.

The technique described in JP-A-H05-300752 has a function only to identify whether any of the alarm signals has occurred or not. Therefore, there is a disadvantage that it is impossible to know which factor caused the alarm signal to occur.

On the other hand, the technique described in JP-A-2009-142016 can indeed contribute to reduction of the number of input terminals (the number of photocouplers to be used), but it is used for transmission of regular signals which are not alarm signals. Therefore, it is a matter of course that the technique does not have a function of determining which one of the alarm signals has occurred. Moreover, the technique can separate two signals on the assumption that the two signals are always transmitted in predetermined forms and at predetermined timings. Therefore, there is a disadvantage that the technique cannot be applied to signals such as alarm signals which cannot be known as to when they will occur.

SUMMARY OF THE INVENTION

Therefore, an object of the invention is to provide an alarm processing circuit in which one signal transmission path can be shared by a plurality of alarm signals and which can determine which type of abnormality caused an alarm signal even when the alarm signal occurred at any timing.

The invention can achieve the object by providing an alarm processing circuit including: a plurality of abnormality detection circuits for detecting different abnormalities and outputting alarm signals respectively; a signal conversion circuit for converting the alarm signals outputted from the plurality of abnormality detection circuits into time signals with unique time widths corresponding to types of the abnormalities respectively; and a determination circuit for determining the types of the abnormalities respectively based on the time widths of the time signals outputted from the signal conversion circuit respectively.

For example, the signal conversion circuit may include a plurality of timers activated by the alarm signals outputted from the plurality of abnormality detection circuits, for outputting the time signals, respectively, and an OR circuit for taking a logical sum of the output signals of the plurality of timers.

For example, the plurality of abnormality detection circuits may be used for detecting abnormalities relevant to an inverter device.

One of the plurality of abnormality detection circuits may have an arrangement to detect a short-circuit current flowing into a power element of a bridge circuit of the inverter device as an abnormality. In this case, an output signal of the corresponding timer activated by the alarm signal outputted from the one abnormality detection circuit may be used as a control signal for stopping driving of the power element.

In addition, the alarm processing circuit may further include a signal processing circuit for extracting a single waveform time signal from any of the time signals outputted from the signal conversion circuit when the time signal has repetitive waveforms.

In a preferable embodiment, the alarm processing circuit may further include another abnormality detection circuit for outputting an alarm signal with a time width shorter than a shortest time width of the time widths of the time signals outputted from the timers so that the alarm signal can be inputted as a time signal to the OR circuit.

The determination circuit may be arranged to determine an output signal of the OR circuit as noise when the time width of the output signal of the OR circuit is shorter than the shortest time width of the time widths of the time signals outputted from the respective timers.

According to the invention, the alarm signals outputted from the plurality of abnormality detection circuits can be converted into the time signals with the unique time widths corresponding to the types of the abnormalities respectively. Accordingly, one signal transmission path which transmits the time signals can be shared by the plurality of alarm signals. This contributes to simplification of the structure and reduction of the cost. Moreover, even when any of the alarm signals has occurred at any timing, it is possible to determine which type of abnormality causes the alarm signal. Accordingly, the invention is useful as an alarm processing circuit applied to an intelligent power module etc.

DETAILED DESCRIPTION OF THE INVENTION

An embodiment of an alarm processing circuit according to the invention will be described below with reference to the drawings.

Figure 1:
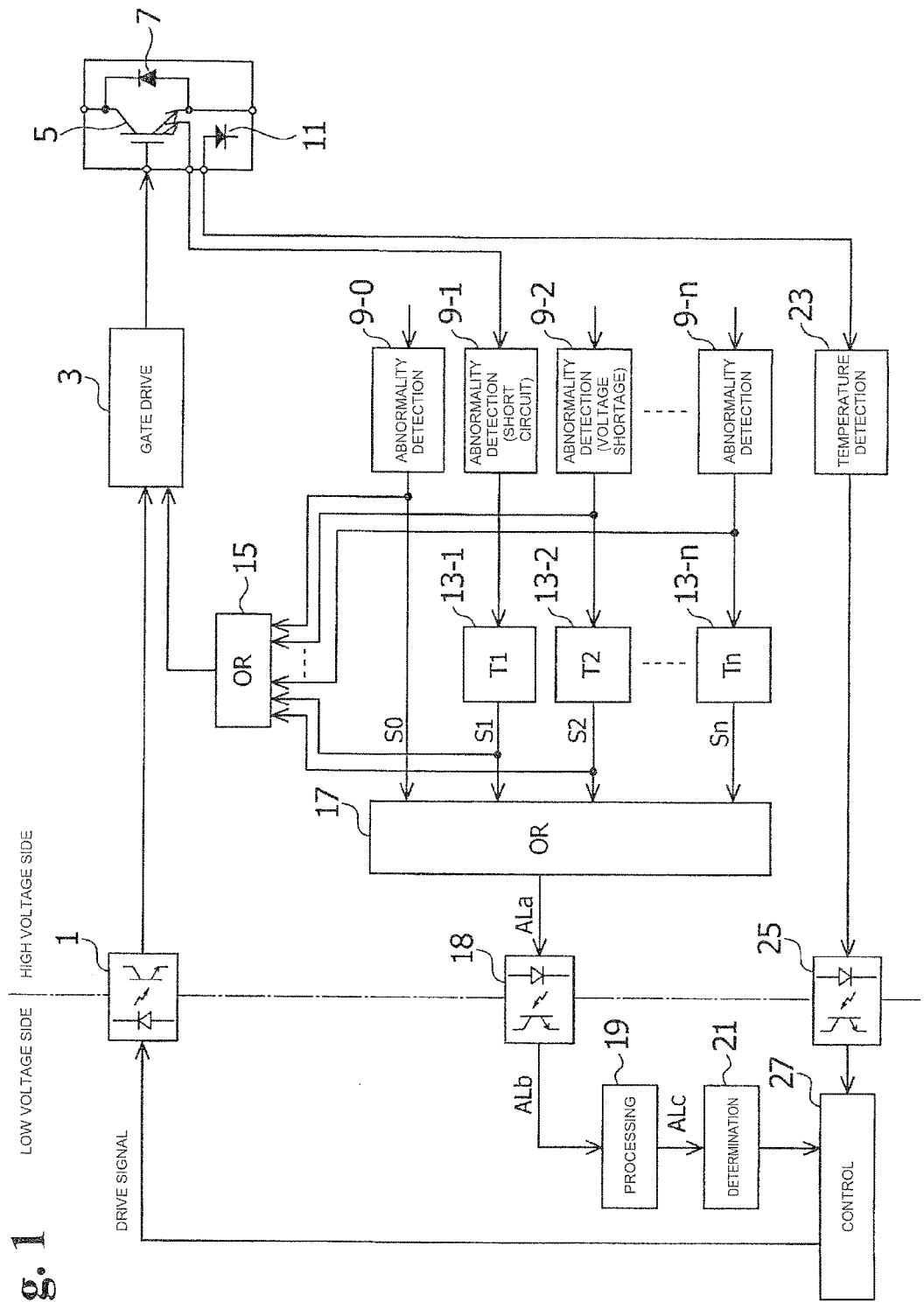
FIG. 1 is a block diagram showing an embodiment of an alarm processing circuit according to the invention.

In FIG. 1, a drive signal is inputted to a gate drive circuit 3 through a photocoupler 1. The gate drive circuit 3 transmits the drive signal to a gate terminal of an IGBT (Insulated Gate Bipolar Transistor) 5 in a normal state in which an output stop instruction signal which will be described later is not inputted.

For example, the IGBT 5 in the embodiment is used as a power element (switching element) of a bridge circuit of an inverter device for supplying electric power to an electric car motor. The IGBT 5 has a sense terminal (current detection emitter terminal). A free wheel diode 7 is connected in parallel with the IGBT 5.

Abnormality detection circuits 9-0 to 9-n (n is an integer not smaller than 1) detect different abnormalities occurring in the inverter device, and output signals indicating the abnormalities respectively. Here, the abnormality detection circuits 9-1 and 9-2 will be described specifically.

The abnormality detection circuit 9-1 compares a current outputted from the sense terminal of the IGBT 5 with a threshold current. When the former current exceeds the latter current, the abnormality detection circuit 9-1 outputs an alarm signal indicating that a short-circuit current is flowing into the IGBT 5.

The short-circuit current occurs as follows. That is, another IGBT which forms an opposed arm is connected in series with the IGBT 5 which forms an arm of the bridge circuit of the inverter device. When the IGBT 5 turns ON by mistake due to a failure, noise, etc. of the gate drive circuit relevant to the IGBT 5 in an ON period of the IGBT of the opposed arm shown in FIG. 2A, an excessively large collector current Ic (short-circuit current) shown in FIG. 2B flows into the IGBT 5 in response to an ON operation of the IGBT 5. On this occasion, a sense current outputted from the sense terminal of the IGBT 5 increases abnormally. Accordingly, occurrence of the short-circuit current can be detected by the abnormality detection circuit 9-1 which monitors the sense current.

Figure 4:
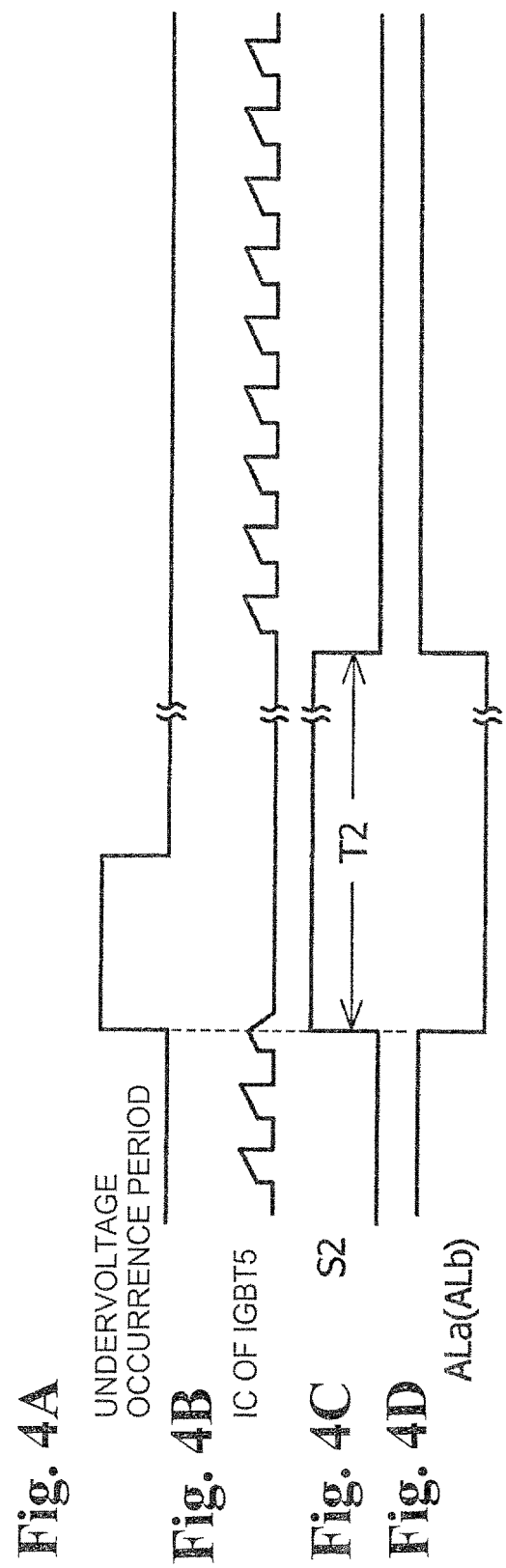
FIGS. 4A to 4D are timing charts showing an undervoltage occurrence period and a time counting operation of the timer.

On the other hand, the abnormality detection circuit 9-2 compares a power supply voltage applied to the gate drive circuit 3, the abnormality detection circuits 9-0 to 9-n, etc. with a threshold voltage. When the former voltage is lower than the latter voltage, the abnormality detection circuit 9-2 outputs an alarm signal which is shown in FIG. 4A and which indicates a period of the shortage of the power supply voltage.

Any of the other abnormality detection circuits can also detect a predetermined abnormality and output an alarm signal indicating that abnormality. Incidentally, each of the alarm signals outputted from the abnormality detection circuits 9-0 to 9-n is a signal which can change from an L (Low) level to an H (High) level.

Figure 2:
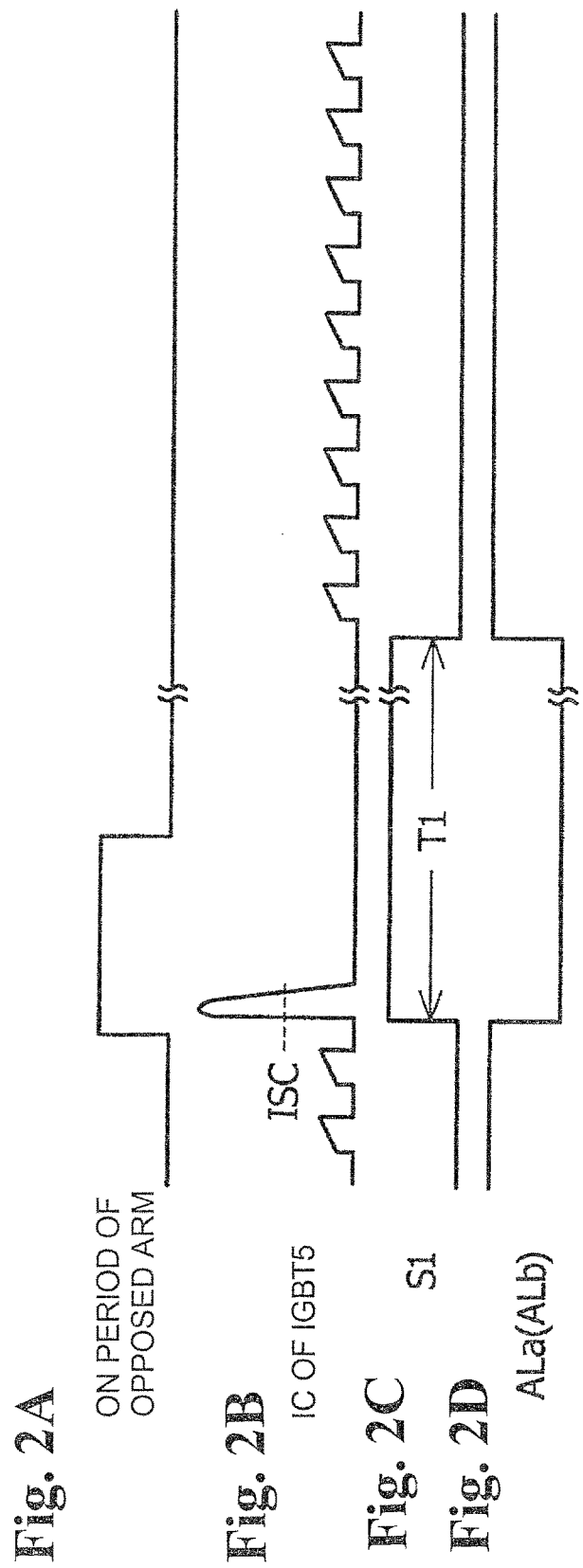
FIGS. 2A to 2D are timing charts showing an ON period of an opposed arm, a timing of occurrence of a short-circuit current, and a time counting operation of a timer.
Figure 3:
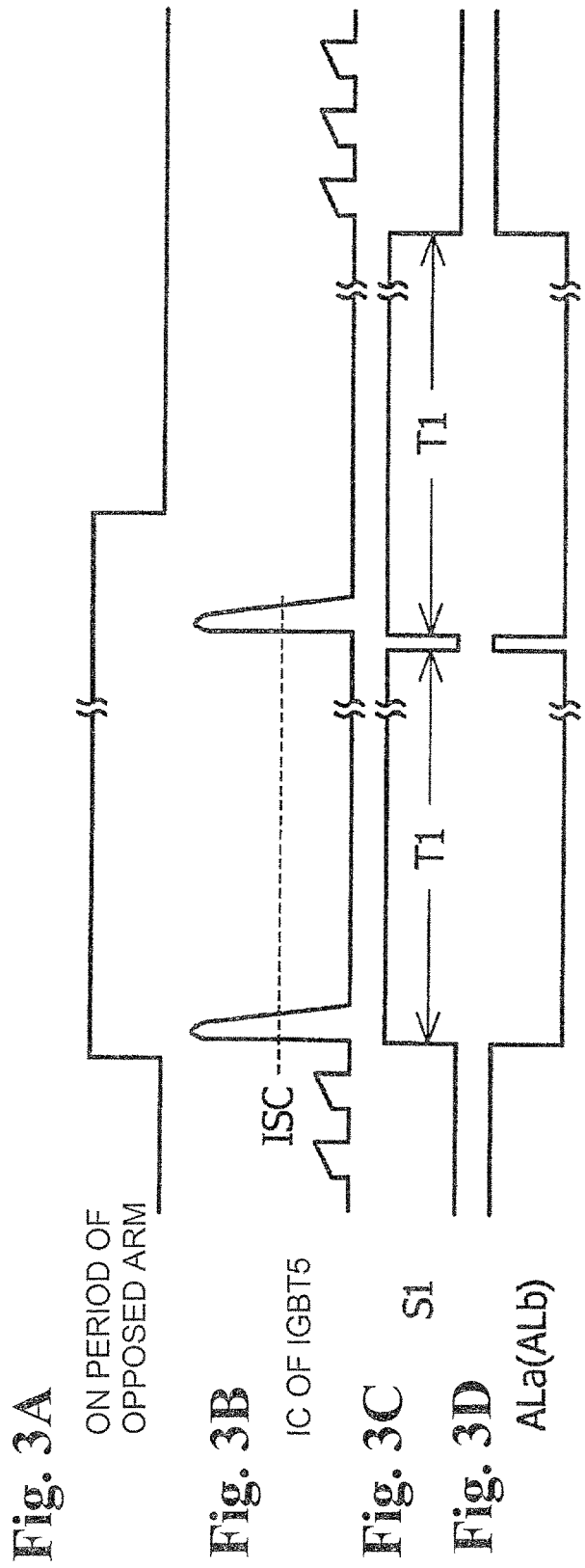
FIGS. 3A to 3D are other timing charts showing the ON period of the opposed arm, the timing of occurrence of the short-circuit current, and the time counting operation of the timer.

Timers 13-1 to 13-n count predetermined times T1 to Tn (T0<T1< . . . <Tn) at timings when the alarm signals are outputted from the abnormality detection circuits 9-1 to 9-n respectively. Output signals S1 to Sn of the timers 13-1 to 13-n are time signals which keep the H level as long as the timers 13-1 to 13-n are counting times. FIG. 2C shows the signal S1 with a time width T1 (e.g. 10 mS) outputted from the timer 13-1. In addition, FIG. 4C shows the signal S2 with a time width T2 (e.g. 100 mS) outputted from the timer 13-2.

Incidentally, an abnormal state detected by the abnormality detection circuit 9-0 is recovered to a normal state within a shorter time than the counting time T1 of the timer 13-1.

When any of the abnormality detection circuits 9-0 to 9-n detects an abnormality, it is necessary to stop the supply of the gate drive signal to the IGBT 5 in order to prevent malfunction of the inverter device, damage to elements forming the inverter device, etc.

Therefore, the gate drive circuit 3 operates to stop the output of the gate drive signal in the aforementioned abnormal state. That is, when an alarm signal is outputted from any of the abnormality detection circuits 9-0, 9-2, 9-3, . . . and 9-n or when the signal S1 or S2 is outputted from the timer 13-1 or 13-2, the outputted signal is inputted to an OR circuit 15. On this occasion, the OR circuit 15 outputs the outputted signal as a signal stop instruction signal to the gate drive circuit 3. As a result, the gate drive circuit 3 stops the output of the gate drive signal as long as the signal stop instruction signal is outputted from the OR circuit 15, i.e. as long as any of the abnormality detection circuits 9-0 to 9-n detects an abnormality.

Meanwhile, not the alarm signal outputted from the abnormality detection circuit 9-1 but the output signal S1 of the timer 13-1 is inputted to the OR circuit 15. The reason will be described as follows.

The alarm signal outputted from the abnormality detection circuit 9-1 changes from the L level to the H level at a time instant when a short-circuit current occurs. Accordingly, when the alarm signal is inputted to the OR circuit 15, the output of the gate drive signal is stopped simultaneously with generation of the alarm signal, and hence the short-circuit current disappears. When the short-circuit current disappears, the alarm signal outputted from the abnormality detection circuit 9-1 is returned to the L level. Accordingly, the output of the gate drive signal is resumed and the short-circuit current occurs again.

Thus, there is a disadvantage that the short-circuit current occurs repeatedly in the ON period of the opposed arm when the alarm signal outputted from the abnormality detection circuit 9-1 is inputted to the OR circuit 15.

Therefore, in the case where the output signal S1 of the timer 13-1 is inputted to the OR circuit 15 as in the embodiment, the output of the gate drive signal is stopped in the time T1 in which the output signal S1 is at the H level. Accordingly, when the ON period of the opposed arm is shorter than the time width T1 of the output signal S1 of the timer 13-1 as shown in FIGS. 2A to 2D, it is possible to avoid such a disadvantage that the short-circuit current occurs repeatedly in the ON period of the opposed arm.

When the ON period of the opposed arm is longer than the time width T1 of the output signal S1 of the timer 13-1 (T1<ON period<2×T1) as shown in FIGS. 3A to 3D, it is still also possible to avoid such a disadvantage that the short-circuit current occurs repeatedly.

That is, in this case, the timer 13-1 begins to count the time T1 at a timing when a first short-circuit current is detected. After completion of the time counting, the timer 13-1 begins to count the time T1 again at a timing when a next short-circuit current is detected. In the same manner as in the case of FIGS. 2A to 2D, the output of the gate drive signal is stopped during the time counting of the timer 13-1.

Accordingly, it is possible to avoid the disadvantage that the short-circuit current occurs repeatedly also in the example of FIGS. 3A to 3D.

Incidentally, in the case where the ON period of the opposed arm is larger than 2×T1, a time counting operation of the timer 13-1 based on the aforementioned manner is executed. Accordingly, it is also possible to avoid the disadvantage that the short-circuit current occurs repeatedly.

Figure 5:
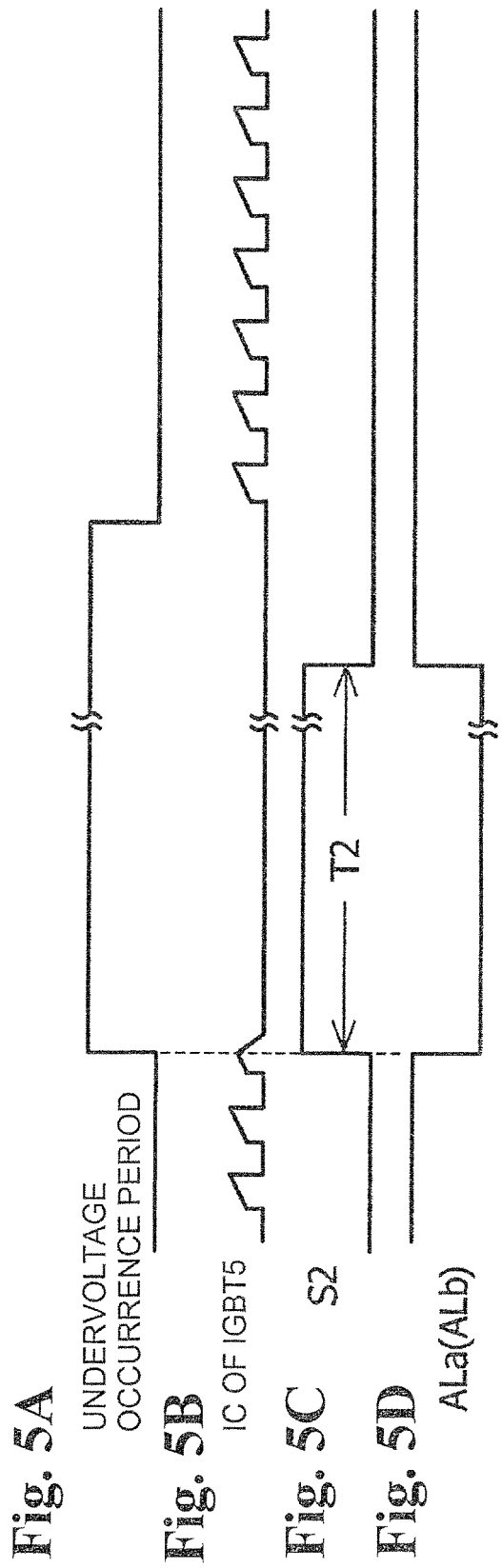
FIGS. 5A to 5D are other timing charts showing the undervoltage occurrence period and the time counting operation of the timer.

Next, description will be made in the case where an alarm signal related to an undervoltage shown in FIG. 4A or FIG. 5A is outputted from the abnormality detection circuit 9-2. In this case, the alarm signal related to the undervoltage is inputted to the OR circuit 15 and the signal S2 outputted from the timer 13-2 is also inputted to the OR circuit 15. Accordingly, in the case where an undervoltage occurrence period is shorter than the time width T2 of the output signal S2 of the timer 13-2 as shown in FIGS. 4A to 4D, the gate drive circuit 3 stops the output of the gate drive signal as long as the signal S2 of the time width T2 is outputted. In addition, in the case where the undervoltage occurrence period is longer than the time width T2 of the output signal S2 of the timer 13-2 as shown in FIGS. 5A to 5D, the gate drive circuit 3 stops the output of the gate drive signal as long as the alarm signal related to the undervoltage is generated or as long as the signal S2 of the time width T2 is outputted. As a result, an ON/OFF operation of the IGBT 5 is stopped to keep the IGBT 5 at an OFF state at least as long as the alarm signal relevant to the undervoltage is generated.

As long as another abnormality detection circuit 9-0, 9-3, . . . , 9-n outputs an alarm signal, the ON/OFF operation of the IGBT 5 is also stopped in the same manner (the IGBT 5 is normally set at an OFF state). In addition, in accordance with the contents of the abnormalities to be detected respectively by the abnormality detection circuits 9-3, . . . , and 9-n, the signals S3, . . . , and Sn corresponding to the abnormalities are inputted to the OR circuit 15 independently or together with the alarm signals outputted from the abnormality detection circuits 9-3, . . . , and 9-n correspondingly to the abnormalities. Incidentally, some or all of the abnormality detection circuits 9-0, 9-3, . . . , and 9-n may be removed in accordance with the subject to which the invention is applied.

In addition, the abnormality detection circuit 9-0 may be used not for detecting a real abnormality but for detecting an irregular operation caused by noise etc. (e.g. the case where noise generates a signal which can be seemingly mistaken for an abnormality but the signal can be distinguished from a real abnormality because it ends in an extremely short time). In this case, setting is made not to input the signal S0 to the OR circuit 15.

As described above, the timers 13-1 to 13-n are activated at timings when the abnormality detection circuits 9-1 to 9-n detect the abnormalities, and output the signals S1 to Sn of the time widths T1 to Tn (T1<T2< . . . <Tn) respectively. Accordingly, the types of the abnormalities detected by the abnormality detection circuits 9-1 to 9-n and the time widths T1 to Tn of the signals S1 to Sn correspond to each other. This means that the types of the abnormalities can be identified based on the time widths T1 to Tn.

The alarm signal S0 outputted from the abnormality detection circuit 9-0 and the output signals S1 to Sn of the timers 13-1 to 13-n are inputted to an OR circuit 17.

Figure 6:
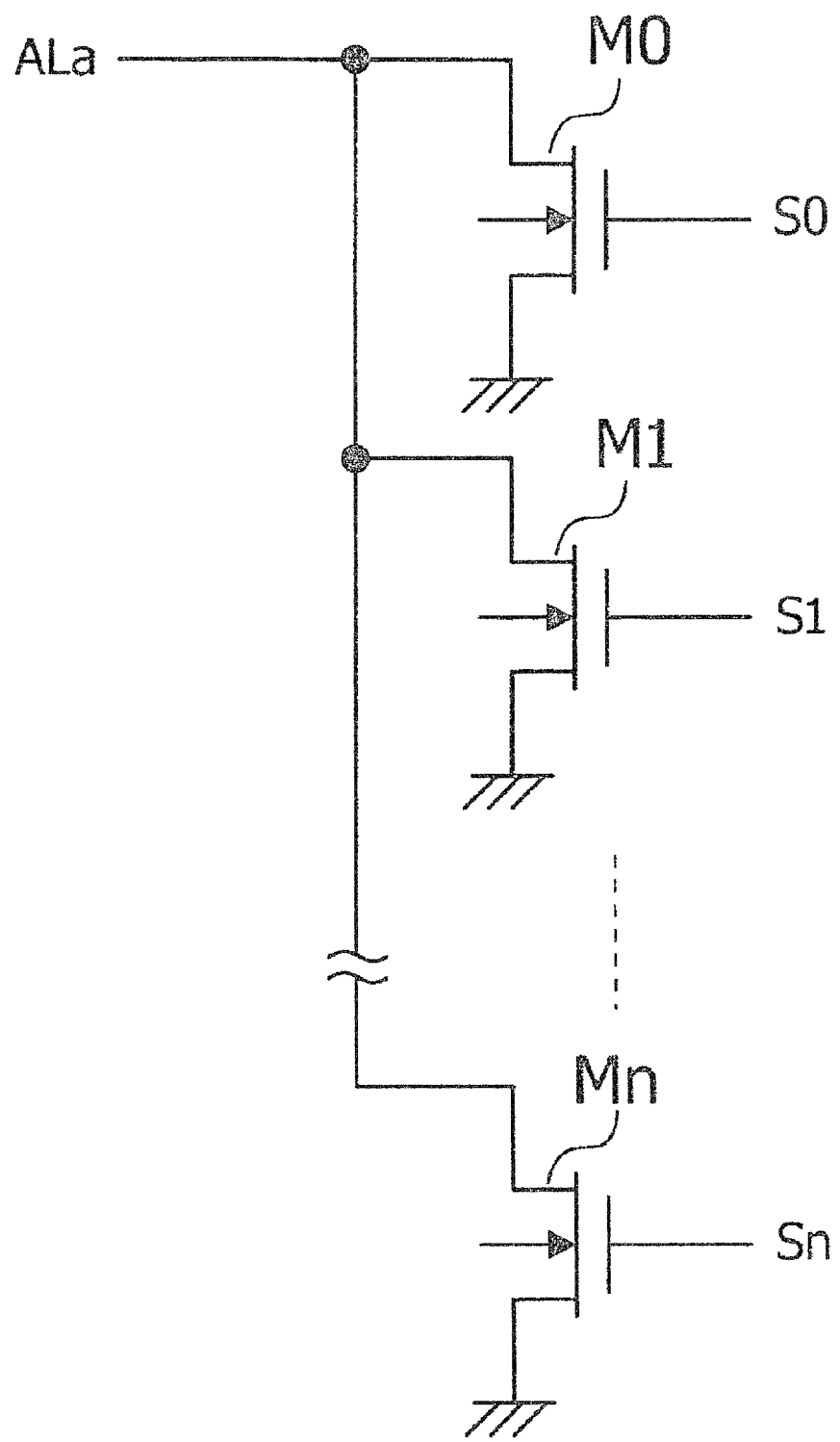
FIG. 6 is a circuit diagram showing an example of an OR circuit.

An example of the OR circuit 17 will be shown in FIG. 6. The OR circuit 17 has a so-called wired OR configuration in which N-channel MOSFETs (Metal-Oxide-Semiconductor Field-Effect Transistors) M0 to Mn are connected in parallel. When any of the input signals S0 to Sn changes to the H level, the OR circuit 17 outputs an L level signal ALa. An example of the signal ALa is shown in FIG. 2D and FIG. 5D.

Figure 7:
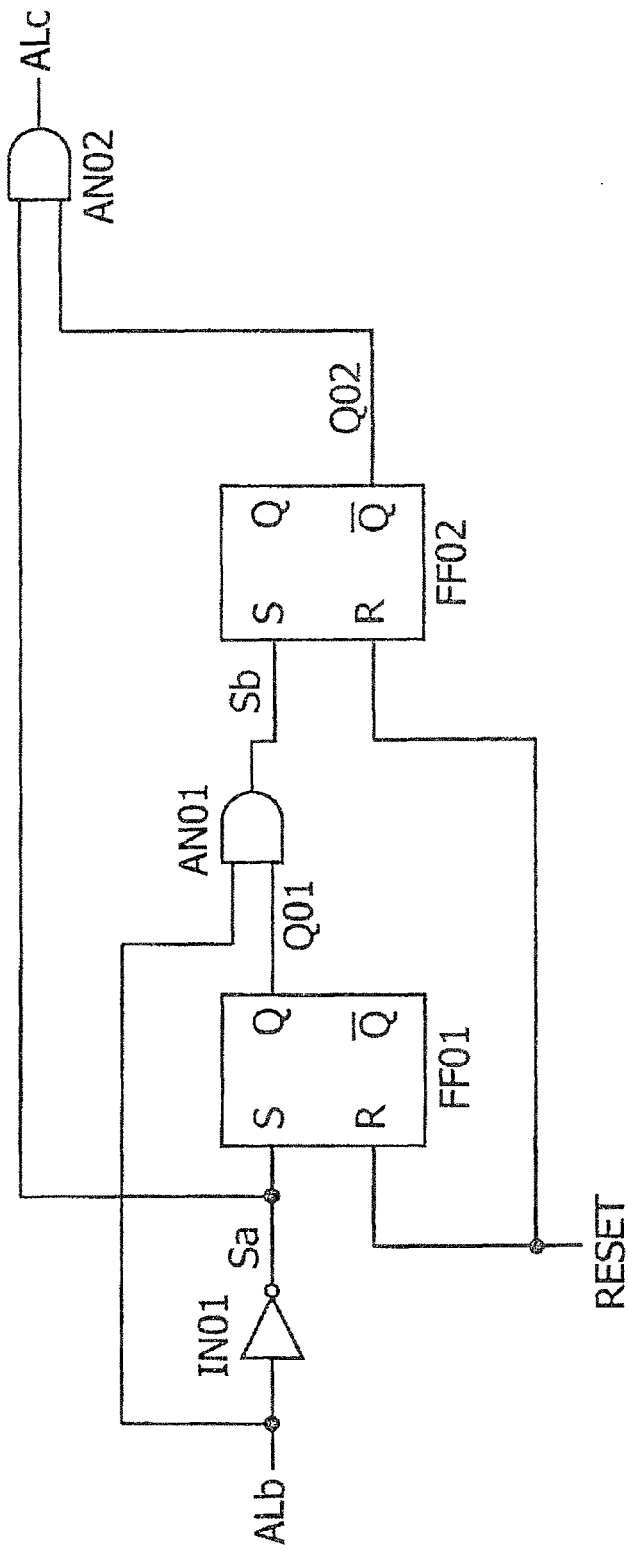
FIG. 7 is a circuit diagram showing an example of a signal processing circuit.

Upon reception of the output signal ALa of the OR circuit 17, a photocoupler 18 outputs a signal ALb corresponding to the received signal ALa. The output signal ALb of the photocoupler 18 is inputted to a signal processing circuit 19 shown in FIG. 7.

Figure 8:
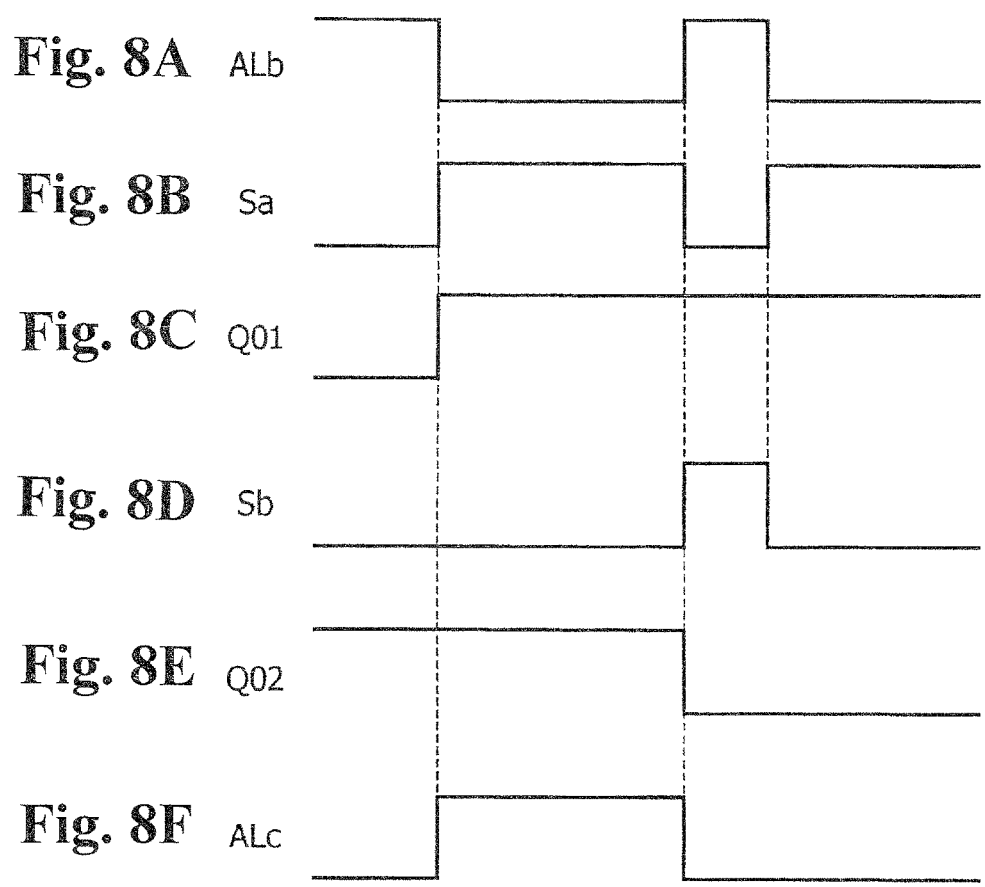
FIGS. 8A to 8F are timing charts showing an operation of the signal processing circuit.

Upon reception of the signal ALb having repetitive waveforms as shown in FIG. 8A, the signal processing circuit 19 operates to extract a single waveform signal ALc shown in FIG. 8F from the signal ALb. Incidentally, the signal ALb shown in FIG. 8A corresponds to a signal ALa (ALb) shown in FIG. 3D.

The structure and function of the signal processing circuit 19 will be described below. The signal processing circuit 19 is provided with an inverter IN01, set/reset flip flops FF01 and FF02, and AND circuits AN01 and AN02. Incidentally, the flip flops FF01 and FF02 are initialized by a reset signal given from the outside.

The inverter IN01 outputs a signal Sa which is formed by inverting the input signal ALb and which is shown in FIG. 8B. Since the signal Sa is inputted to a set terminal of the flip flop FF01, the flip flop FF01 is set at a time when the signal Sa first changes from the L level to the H level. When the flip flop FF01 is set, an output signal Q01 of the flip flop FF01 changes from the L level to the H level as shown in FIG. 8C.

Upon reception of the input signal ALb and the output signal Q01 of the flip flop FF01, the AND circuit AN01 outputs a signal Sb shown in FIG. 8D. Since the signal Sb is inputted to a set terminal of the flip flop FF02, the flip flop FF02 is set at a time when the signal Sb changes from the L level to the H level. When the flip flop FF02 is set, an output signal Q02 of the flip flop FF02 changes from the H level to the L level as shown in FIG. 8E.

Upon reception of the output signal Sa of the inverter IN01 and the output signal Q02 of the flip flop FF02, the AND circuit AN02 outputs a signal ALc shown in FIG. 8F. The signal ALc has a single waveform which is formed by extracting and inverting a leading waveform part of the signal ALb.

Incidentally, when a single waveform signal ALb is inputted to the signal processing circuit 19, the signal ALc having the same single waveform as that of the signal Sa formed by inverting the signal ALb is outputted from the signal processing circuit 19.

Figure 9:
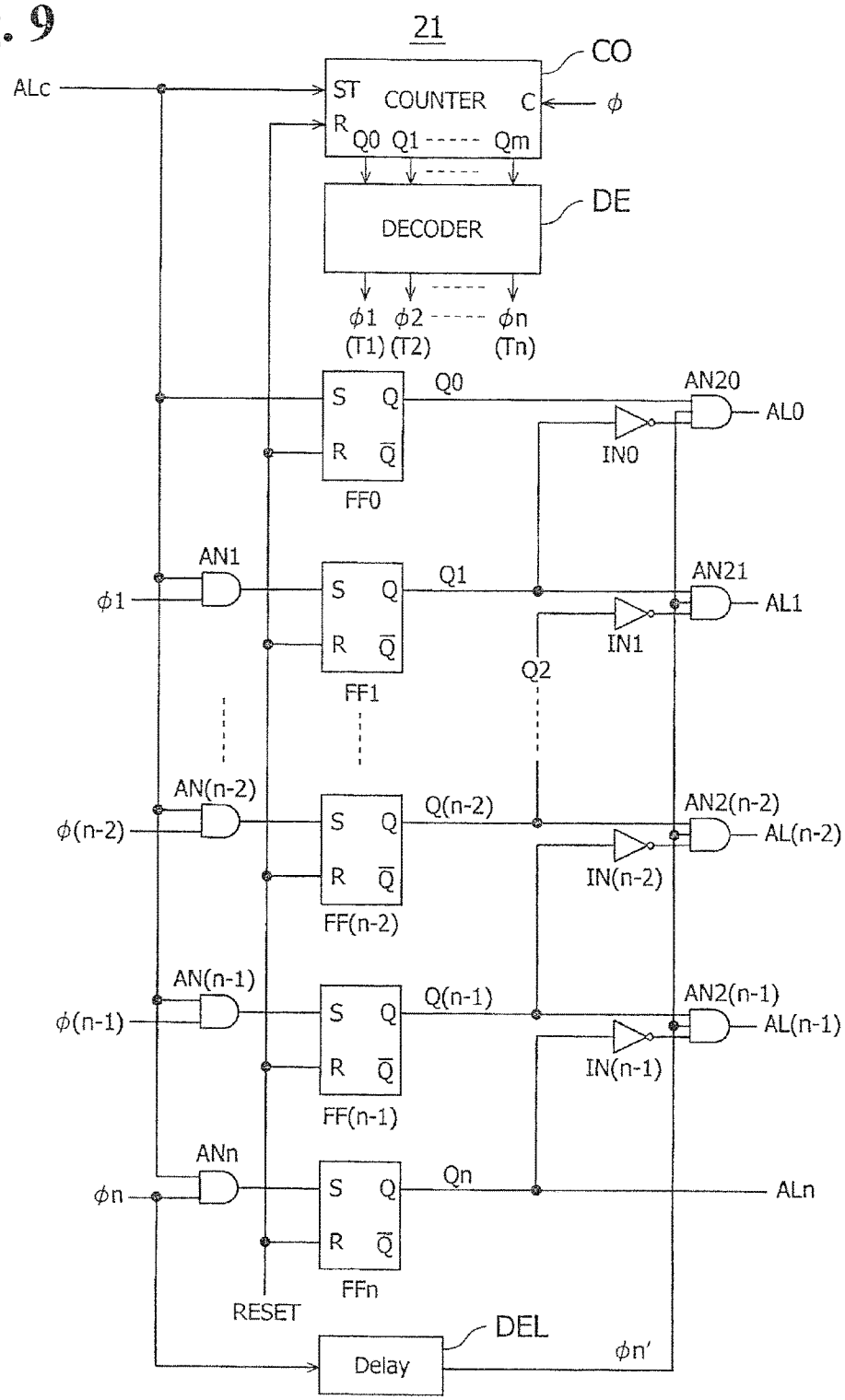
FIG. 9 is a circuit diagram showing an example of a determination circuit.

The output signal ALc of the signal processing circuit 19 is inputted to an alarm determination circuit 21. An example of the configuration of the alarm determination circuit 21 will be shown in FIG. 9.

The alarm determination circuit 21 is provided with a counter CO, a decoder DE, AND circuits AN1 to ANn, set/reset flip flops FF0 to FFn, inverters IN0 to IN(n−1), AND circuits AN20 to AN2(n−1) and a delay circuit DEL. Incidentally, the counter CO and the flip flops FF0 to FFn are initialized by a reset signal given from the outside.

The signal ALc inputted to the alarm determination circuit 21 is inputted to a start terminal ST of the counter CO. At a timing when the signal ALc changes from the L level to the H level, the counter CO starts a count operation so as to count up a clock signal ϕ of a fixed frequency since that time instant. Accordingly, the count value of the counter CO expresses a lapse of the time since the count start time instant. The counter CO stops the count operation at a time instant when all outputs Q0 to Qm of the counter CO have changed to the H level.

The decoder DE imports the outputs Q0 to Qm of the counter CO and outputs respective signals φ1 to φn at a time instant when a combination of the outputs Q0 to Qm represents values corresponding to the times T1 to Tn (T1<T2< . . . <T(n−1)<Tn). The signals φ1 to φn are signals which can change from the L level to the H level. The signals φ1 to φn keep the H level until the counter CO is reset.

The signal ALc is also inputted to a set terminal of the flip flop FF0 and one input terminals of the AND circuits AN1 to ANn. In addition, the output signals φ1 to φn of the decoder DE are inputted to the other input terminals of the AND circuits AN1 to ANn respectively. Further, output signals of the AND circuits AN1 to ANn are inputted to set terminals of the flip flops FF1 to FFn respectively.

Output signals Q0 to Q(n−1) of the flip flops FF0 to FF(n−1) are inputted to first input terminals of the AND circuits AN20 to AN2(n−1) respectively. In addition, output signals Q1 to Qn of the flip flops FF1 to FFn are inverted by the inverters IN0 to IN(n−1) and then inputted to third input terminals of the AND circuits AN20 to AN2(n−1) respectively.

The delay circuit DEL receives the output signal φn of the decoder DE, and outputs a signal φn' which is formed by delaying the signal φn for a predetermined time. The delay signal φn' is inputted to second terminals of the AND circuits AN20 to AN2(n−1).

A determination operation of the alarm determination circuit 21 will be described below.

When an alarm signal is outputted from any of the abnormality detection circuits 9-0 to 9-n shown in FIG. 1, the signal ALc changes from the L level to the H level. Accordingly, count of a clock signal φ is started by the counter CO. Then, the counter CO continues the count operation until all the outputs Q0 to Qm of the counter CO change to the H level. Accordingly, the output signals φ1 to φn of the decoder DE change to the H level sequentially during the count operation of the counter CO. On the other hand, when the signal ALc changes from the L level to the H level, the flip flop FF0 is set. Therefore, the output signal Q0 of the flip flop FF0 changes to the H level.

When a time in which the signal ALc continues the H level is assumed as t here, the time t varies depending on which abnormality detection circuit 9-0 to 9-n outputs the alarm signal. That is, the time t becomes the shortest when the alarm signal is outputted from the abnormality detection circuit 9-0, and becomes the longest when the alarm signal is outputted from the abnormality detection circuit 9-n.

Assume here that the alarm signal is outputted from the abnormality detection circuit 9-0. On this occasion, the time t establishes the relation 0<t<T1. Accordingly, the one input terminals of the AND circuits AN1 to ANn become the L level before the output signal φ1 of the decoder DE changes to the H level. Accordingly, even when the output signals φ1 to φn of the decoder DE then change to the H level sequentially, the flip flops FF1 to FFn maintain their initial reset states.

When the output signal φn of the decoder DE changes to the H level, the delay signal φn' of the H level is outputted from the delay circuit DEL after a lapse of the delay time set by the delay circuit DEL. The AND circuit AN20 which has received the signal Q0 of the H level from the flip flop FF0 and the inverted signal of the H level from the inverter IN0 outputs an H level determination signal AL0 at the same time as the delay signal φn' is inputted from the delay circuit DEL. The determination signal AL0 indicates that the alarm signal has been outputted from the abnormality detection circuit 9-0. Accordingly, the type of the alarm can be identified from the determination signal AL0.

Next, description will be described in the case where an alarm signal has been outputted from the abnormality detection circuit 9-n. Also in the case, the flip flop FF0 is set at the timing when the signal ALc changes from the L level to the H level. In addition, the time t in which the signal ALc continues the H level establishes the relation Ti≤t (here assume that i is equal to 1 to n). Accordingly, the flip flops FF1 to FFn are set sequentially in accordance with the timings when the output signals φ1 to φn of the decoder DE change to the H level.

However, the inverters IN0 to IN(n−1) output L level signals in accordance with the timings when the flip flops FF1 to FFn are set. Accordingly, the AND circuits AN20 to AN2(n−1) are prohibited from outputting the signals AL0 to AL(n−1). As a result, the H level output signal Qn of the flip flop FFn is outputted as a determination signal ALn.

Next, description will be made in the case where an alarm signal has been outputted from the abnormality detection circuit 9-i (here assume that i is equal to 1 to (n−1)).

Also in the case, the flip flop FF0 is set at the timing when the signal ALc changes from the L level to the H level. In addition, the time t in which the signal ALc continues the H level establishes the relation Ti≤t≤T(i+1). Accordingly, the flip flops FF1 to FFi are set sequentially in accordance with the timings when the output signals φ1 to φi of the decoder DE change to the H level.

In accordance with this, the inverters IN0 to IN(i−1) output L level signals in accordance with the timings when the flip flops FF1 to FFi are set. Accordingly, the AND circuits AN20 to AN2(i−1) are prohibited from outputting the H level signals AL0 to AL(i−1). As a result, an H level determination signal ALi is outputted from the AND circuit AN2i at the same time as the delay signal φn' is outputted from the delay circuit DEL.

Incidentally, the set inputs of the flip flops FF(i+1) to FFn do not change to the H level. Accordingly, the flip flops FF(i+1) to FFn remain reset so that the outputs Q(i+1) to Qn of the flip flops FF(i+1) to FFn can maintain the L level. Accordingly, the signals AL(i+1) to ALn do not change to the H level.

Based on the determination signals AL0 to ALn outputted from the alarm determination circuit 21, a control circuit 27 shown in FIG. 1 displays occurrence of the alarm and the type of the occurring alarm on a display not-shown in the drawing, or transmits the information to another device not-shown in the drawing.

Figure 10:
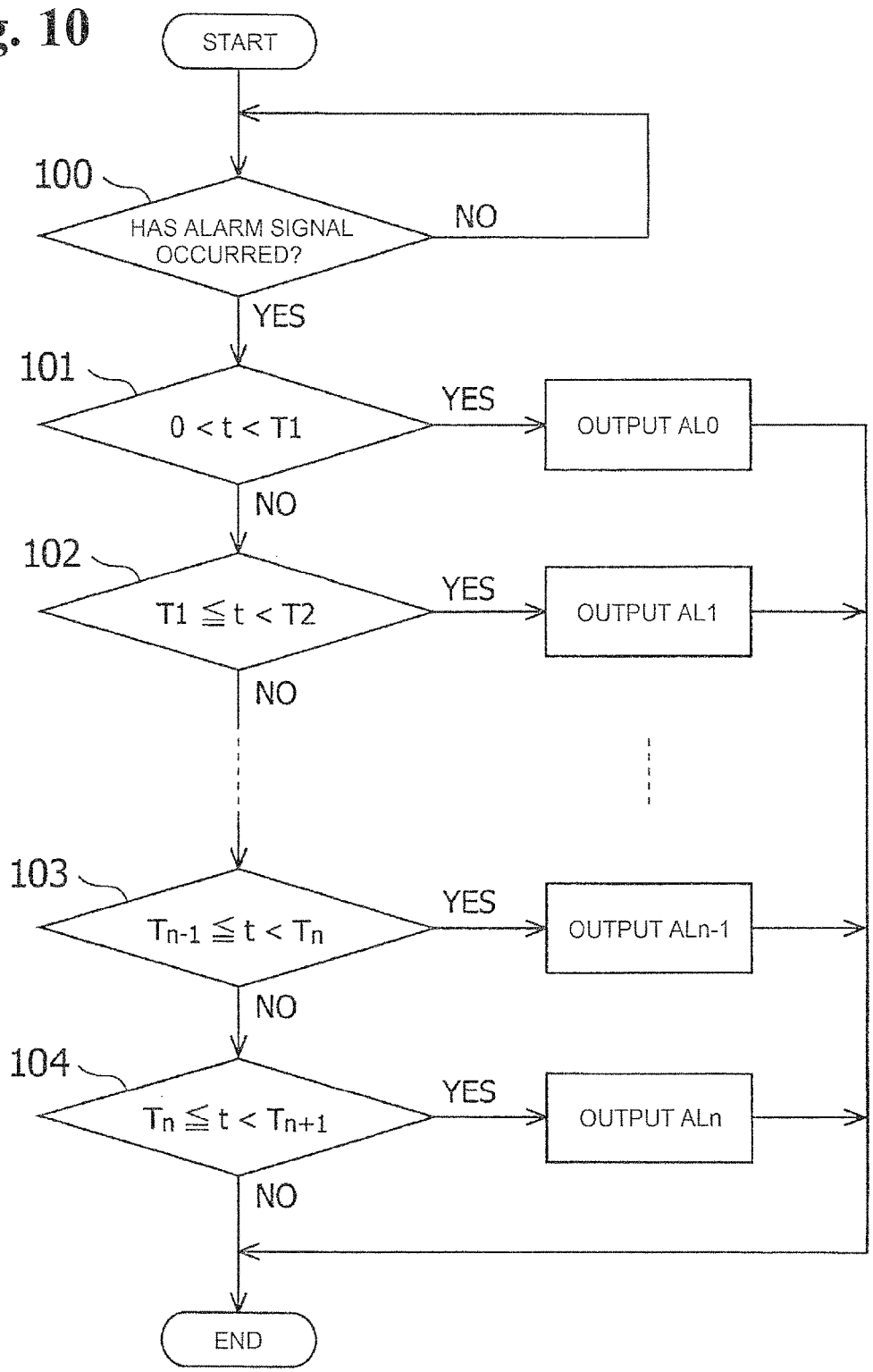
FIG. 10 is a flow chart showing an example of a procedure for determining a type of alarm.

FIG. 10 is a flowchart showing the outline of the aforementioned alarm determination process. Although the alarm determination process is executed by use of a logic circuit in the embodiment, it is also a matter of course that the alarm determination process may be also executed by use of a microprocessor.

Incidentally, a temperature detection circuit 23 shown in FIG. 1 detects the temperature of the IGBT (e.g. the temperature of the chip) based on an output signal of a temperature sensor (temperature detection diode) 11 and transmits a signal corresponding to the temperature to the control circuit 27 through a photocoupler 25.

The IGBT 5 overheats due to the increase of a load etc. Therefore, the control circuit 27 determines whether the IGBT 5 is overheating or not based on the temperature detected by the temperature detection circuit 23. When determination is made that the IGBT 5 is overheating, the control circuit 27 executes, for example, a process of reducing a power supply voltage applied to the IGBT 5.

The invention is not limited to the embodiment mentioned above but may include various modifications. For example, the abnormality detection circuit 9-0 shown in FIG. 1 may be removed as described above. In this case, upon reception of a signal ALc with a time width shorter than the shortest one of the time widths of the time signals S1 to Sn outputted from the timers 13-1 to 13-n, the alarm determination circuit 21 determines the signal as a signal based on noise and outputs the determination signal AL0 from the AND circuit AN20. The flow chart shown in FIG. 10 corresponds to this case. Accordingly, when the signal ALc with the time width shorter than the shortest one of the time widths of the time signals S1 to Sn is inputted, the inputted signal is regarded as noise and neglected.

In addition, the photocoupler may be replaced by an isolation transformer etc.

According to the alarm processing circuit according to the embodiment, alarm signals outputted from the abnormality detection circuits 9-1 to 9-n are converted into time signals with unique time widths corresponding to the types of the abnormalities respectively. Accordingly, one signal transmission path transmitting the time signals, specifically, one signal transmission path including one photocoupler 18 shown in FIG. 1 can be shared by the plurality of alarm signals. Moreover, even when an alarm signal occurred at any timing, it is possible to determine the type of abnormality causing the alarm signal.

What is claimed is:

1. An alarm processing circuit comprising:
   a plurality of abnormality detection circuits for detecting different abnormalities and outputting alarm signals respectively;
   a signal conversion circuit for converting the alarm signals outputted from the plurality of abnormality detection circuits into time signals with time widths corresponding to types of the abnormalities respectively;
   a determination circuit for determining the types of the abnormalities based on the time widths of the time signals outputted from the signal conversion circuit respectively; and
   further comprising a signal processing circuit for extracting a single waveform time signal from the time signals outputted from the signal conversion circuit when the time signal has repetitive waveforms.

2. An alarm processing circuit according to claim 1, wherein the signal conversion circuit includes:
   a plurality of timers activated by the alarm signals outputted from the plurality of abnormality detection circuits, and outputting the time signals respectively; and
   an OR circuit for taking a logical sum of the output signals of the plurality of timers.

3. An alarm processing circuit according to claim 2, wherein the plurality of abnormality detection circuits is arranged for detecting the abnormalities associated to an inverter device.

4. An alarm processing circuit comprising:
   a plurality of abnormality detection circuits for detecting different abnormalities and outputting alarm signals respectively;
   a signal conversion circuit for converting the alarm signals outputted from the plurality of abnormality detection circuits into time signals with time widths corresponding to types of the abnormalities respectively; and
   a determination circuit for determining the types of the abnormalities based on the time widths of the time signals outputted from the signal conversion circuit respectively,
   wherein the signal conversion circuit includes:
      a plurality of timers activated by the alarm signals outputted from the plurality of abnormality detection circuits, and outputting the time signals respectively; and
      an OR circuit for taking a logical sum of the output signals of the plurality of timers,
   the plurality of abnormality detection circuits is arranged for detecting the abnormalities associated to an inverter device,
   one of the abnormality detection circuits is arranged for detecting a short-circuit current flowing into a power element of a bridge circuit of the inverter device as an abnormality, and
   the alarm signal outputted from the one abnormality detection circuit activates the output signal of the corresponding timer so that the output signal as a control signal stops driving of the power element.

5. An alarm processing circuit according to claim 2, further comprising:
   another abnormality detection circuit for outputting an alarm signal with a time width shorter than a shortest time width of the time widths of the time signals outputted from the plurality of timers so that the alarm signal is inputted as a time signal to the OR circuit.

6. An alarm processing circuit comprising:
   a plurality of abnormality detection circuits for detecting different abnormalities and outputting alarm signals respectively;
   a signal conversion circuit for converting the alarm signals outputted from the plurality of abnormality detection circuits into time signals with time widths corresponding to types of the abnormalities respectively; and
   a determination circuit for determining the types of the abnormalities based on the time widths of the time signals outputted from the signal conversion circuit respectively,
   wherein the signal conversion circuit includes:
      a plurality of timers activated by the alarm signals outputted from the plurality of abnormality detection circuits, and outputting the time signals respectively; and
      an OR circuit for taking a logical sum of the output signals of the plurality of timers, and
   the determination circuit is arranged to determine the time signal as noise when the signal conversion circuit outputs the time signal with the time width shorter than a shortest time width in the time widths of the time signals outputted from the respective timers.

* * * * *

UNITED STATES PATENT AND TRADEMARK OFFICE
CERTIFICATE OF CORRECTION

PATENT NO. : 9,842,480 B2
APPLICATION NO. : 14/807385
DATED : December 12, 2017
INVENTOR(S) : Noriho Terasawa et al.

It is certified that error appears in the above-identified patent and that said Letters Patent is hereby corrected as shown below:

In the Specification

Please change Column 3, Line 19, from "... of abridge circuit ..." to --... of a bridge circuit ...--.

Please change Column 8, Line 49, from "... a flowchart ..." to --... a flow chart ...--.

Signed and Sealed this
Twenty-fourth Day of July, 2018

Andrei Iancu
*Director of the United States Patent and Trademark Office*